(12) United States Patent
Khor et al.

(10) Patent No.: US 11,557,530 B2
(45) Date of Patent: Jan. 17, 2023

(54) SEMICONDUCTOR DEVICES AND METHODS OF MAKING THE SAME

(71) Applicant: SEMICONDUCTOR COMPONENTS INDUSTRIES, LLC, Phoenix, AZ (US)

(72) Inventors: Swee Har Khor, Kuala Lumpur (MY); Tian Hing Lim, Selangor (MY); Hui Min Ler, Seremban (MY); Chee Hiong Chew, Seremban (MY); Phillip Celaya, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 212 days.

(21) Appl. No.: 16/903,706

(22) Filed: Jun. 17, 2020

(65) Prior Publication Data

US 2020/0312749 A1 Oct. 1, 2020

Related U.S. Application Data

(62) Division of application No. 14/842,571, filed on Sep. 1, 2015, now Pat. No. 10,727,170.

(51) Int. Cl.
*H01L 23/495* (2006.01)
*H01L 23/00* (2006.01)
(Continued)

(52) U.S. Cl.
CPC .. *H01L 23/49513* (2013.01); *H01L 23/49524* (2013.01); *H01L 23/60* (2013.01); *H01L 24/83* (2013.01); *H01L 24/92* (2013.01); *H01L 24/97* (2013.01); *H01L 25/0655* (2013.01); *H01L 25/072* (2013.01); *H01L 25/50* (2013.01); *H01L 21/4828* (2013.01); *H01L 23/3121* (2013.01); *H01L 23/49548* (2013.01); *H01L 23/49562* (2013.01); *H01L 23/49575* (2013.01); *H01L 24/27* (2013.01); *H01L 24/29* (2013.01); *H01L 24/32* (2013.01); *H01L 24/33* (2013.01); *H01L 24/40* (2013.01); *H01L 24/48* (2013.01); *H01L 24/84* (2013.01); *H01L 2224/04026* (2013.01); *H01L 2224/04034* (2013.01); *H01L 2224/04042* (2013.01); *H01L 2224/26175* (2013.01);
(Continued)

(58) Field of Classification Search
CPC ............ H01L 23/49541; H01L 23/495; H01L 2224/16245–1626; H01L 23/49513; H01L 24/83; H01L 2224/83192; H01L 2224/83007; H01L 24/03; H01L 21/00; H01L 21/4814; H01L 21/67721; H01L 23/49537; H01L 23/49544; H01L 23/49565; H01L 23/49575; H01L 23/49579; H01L 23/49582; H01L 23/49586; H01L 23/52; B23C 45/00; B23C 45/14; B23C 45/14639; B23C 45/14655; B23C 2045/14663; B23C 2045/14672; B23C 45/1468; H01S 5/02244; Y10T 29/49121
See application file for complete search history.

(56) References Cited

U.S. PATENT DOCUMENTS 6,300,155 B1 10/2001 Taki et al.
6,316,736 B1 11/2001 Jairazbhoy et al.
(Continued)

*Primary Examiner* — Julio J Maldonado
*Assistant Examiner* — Stanetta D Isaac
(74) *Attorney, Agent, or Firm* — Adam R. Stephenson, Ltd.

(57) ABSTRACT

In one embodiment, methods for making semiconductor devices are disclosed.

20 Claims, 4 Drawing Sheets

(51) Int. Cl.
    *H01L 25/065* (2006.01)
    *H01L 25/07* (2006.01)
    *H01L 25/00* (2006.01)
    *H01L 23/60* (2006.01)
    *H01L 21/48* (2006.01)
    *H01L 23/31* (2006.01)

(52) U.S. Cl.
    CPC ......... *H01L 2224/2731* (2013.01); *H01L 2224/2732* (2013.01); *H01L 2224/27312* (2013.01); *H01L 2224/27334* (2013.01); *H01L 2224/291* (2013.01); *H01L 2224/2919* (2013.01); *H01L 2224/29078* (2013.01); *H01L 2224/29191* (2013.01); *H01L 2224/29294* (2013.01); *H01L 2224/32225* (2013.01); *H01L 2224/32245* (2013.01); *H01L 2224/33181* (2013.01); *H01L 2224/40227* (2013.01); *H01L 2224/40247* (2013.01); *H01L 2224/40499* (2013.01); *H01L 2224/48247* (2013.01); *H01L 2224/73263* (2013.01); *H01L 2224/73265* (2013.01); *H01L 2224/83002* (2013.01); *H01L 2224/83191* (2013.01); *H01L 2224/83192* (2013.01); *H01L 2224/83815* (2013.01); *H01L 2224/83855* (2013.01); *H01L 2224/84815* (2013.01); *H01L 2224/84855* (2013.01); *H01L 2224/9221* (2013.01); *H01L 2224/92157* (2013.01); *H01L 2224/92247* (2013.01); *H01L 2224/97* (2013.01); *H01L 2924/00014* (2013.01); *H01L 2924/13091* (2013.01)

(56) References Cited

U.S. PATENT DOCUMENTS

| | | |
|---|---|---|
| 8,519,520 B2 | 8/2013 | Gong et al. |
| 2006/0047016 A1 | 3/2006 | Wolman |
| 2009/0236613 A1 | 9/2009 | Maruo et al. |
| 2012/0063038 A1 | 3/2012 | Yin et al. |
| 2012/0068321 A1 | 3/2012 | Watanabe et al. |
| 2014/0084436 A1 | 3/2014 | Funatsu et al. |
| 2014/0232015 A1 | 8/2014 | Otremba et al. |
| 2014/0264806 A1 | 9/2014 | Arbuthnot et al. |
| 2015/0155217 A1 | 6/2015 | Kim |

SEMICONDUCTOR DEVICES AND METHODS OF MAKING THE SAME

CROSS REFERENCE TO RELATED APPLICATIONS

This application is a divisional application of the earlier U.S. Utility Patent Application to Khor et al. entitled "Semiconductor Devices and Methods of Making the Same," application Ser. No. 14/842,571, filed Sep. 1, 2015, the disclosure of which is hereby incorporated entirely herein by reference.

BACKGROUND

The present application relates, in general, to electronics, and more particularly, to methods of attaching semiconductor dies to a substrate.

The semiconductor industry typically utilizes various methods and structures to form packages that encapsulate a semiconductor die and provide leads for electrically connecting to the semiconductor die. In one type of semiconductor package, the semiconductor die is mounted between a lead frame and a clip. The lower lead frame has a continuous flat surface on which the die is mounted then a clip is used to complete the electrical circuit on the top of the die. During mounting of both the die and clip, a die attachment material, such as solder, is typically used between the die and lead frame and between the clip and die. The die attachment material can exhibit uncontrolled movement that causes electrical shorting of active circuitry or metal structures.

Accordingly, it is desirable to have techniques for mounting a semiconductor die that can reduce or eliminate uncontrolled movement of die attachment materials.

BRIEF DESCRIPTION OF THE DRAWINGS

Embodiments of present application will become more fully understood from the detailed description and the accompanying drawings, which are not intended to limit the scope of the present application.

Figure 1A:
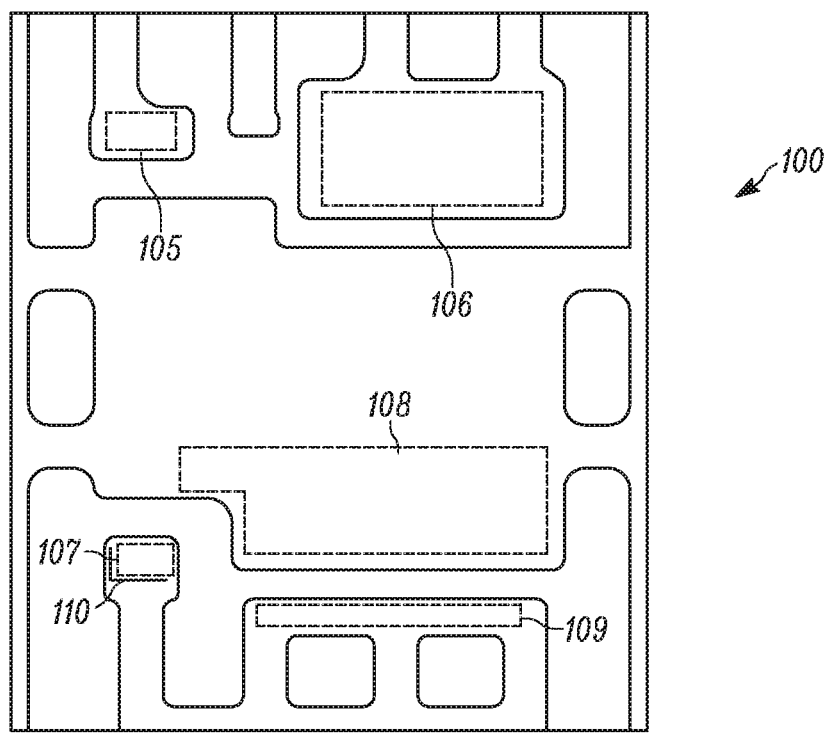
FIG. 1A is a top view illustrating one example of a lead frame in accordance with some embodiments of the present application.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present disclosure. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The following description of embodiment(s) is merely illustrative in nature and is in no way intended to limit the present disclosure, its application, or uses. The present application includes, among other things, a method of making a semiconductor device including: providing a substrate, the substrate comprising a non-conductive barrier material disposed on a first portion of a first side of the substrate; applying a die attachment material to a second portion of the first side of the substrate, wherein the non-conductive barrier material is disposed between a first region of the first side of the substrate having at least a portion of the die attachment material and a second region of the first side of the substrate that does not have the die attachment material; and attaching a semiconductor die to at least the first region of the first side of the substrate.

Some embodiments disclosed herein include a method of making a semiconductor device. The method can include providing a substrate, such as a lead frame. FIG. 1A is a top view illustrating one example of lead frame 100 in accordance with some embodiments of the present application.

Lead frame 100 includes mounting regions 105-109 where one or more semiconductor dies can be attached to lead frame 100. Lead frame 100 further includes non-conductive barrier material 110 having an 'L' shape which is adjacent to mounting region 107. As will be discussed in further detail below, non-conductive barrier material 110 can be configured to restrain movement of die attachment materials to inhibit or prevent, for example, electrical shorting. Accordingly, any material with suitable properties for blocking movement of the die attachment material may be used. The non-conductive barrier material can be, for example, a gel, a wet film, a dry film, or an adhesive. In some embodiments, the non-conductive barrier material may be cured by, for example, heating or radiation (e.g., UV light).

Figure 1B:
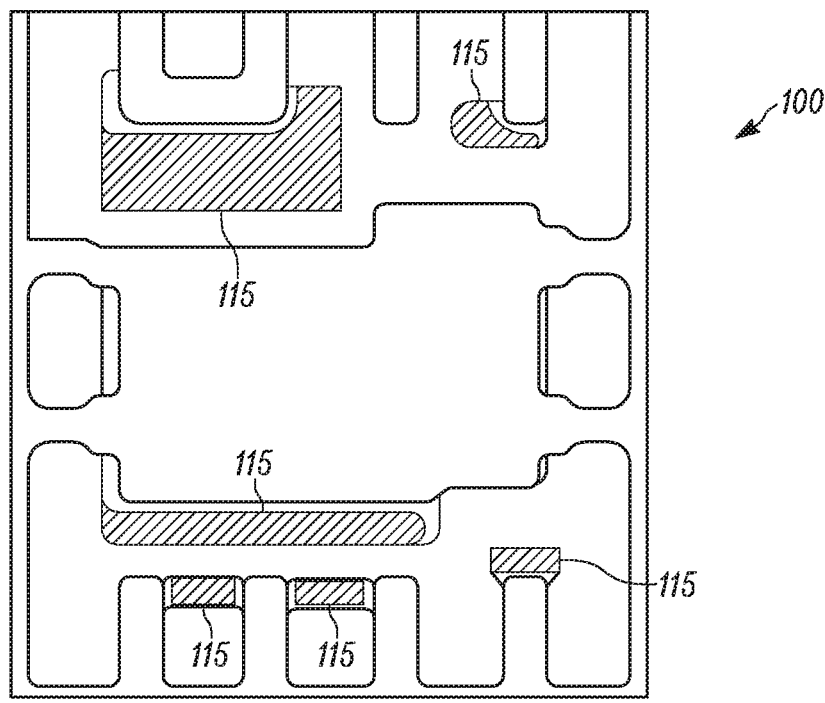
FIG. 1B is a bottom view illustrating the lead frame depicted in FIG. 1A.

FIG. 1B is a bottom view illustrating lead frame 100 in accordance with some embodiments of the present application. The bottom side of lead frame 100 can include etched regions 115. The depth of etched regions 115 is not particularly limited, but can be, for example, approximately half the thickness of lead frame 100. As can be seen by comparing FIG. 1A and FIG. 1B, etched regions 115 are located beneath each of mounting regions 105-109. The footprint of the etched regions can be the same or different than the footprint of the mounting region above the corresponding etched region. One of etched regions 115 can be, in part, located beneath non-conductive barrier material 110. The etched region may, for example, provide wider areas for die size and wirebonding on the top side, while maintaining a smaller area for mounting to a substrate, such as a a printed circuit board. Etched regions 115 can be formed using standard etching techniques, such as wet etching.

FIGS. 2A-E illustrates a method of making a semiconductor device in accordance with some embodiments of the present application. The method can, in some embodiments, be performed using lead frame 100 as depicted in FIGS. 1A-B.

Figure 2A:
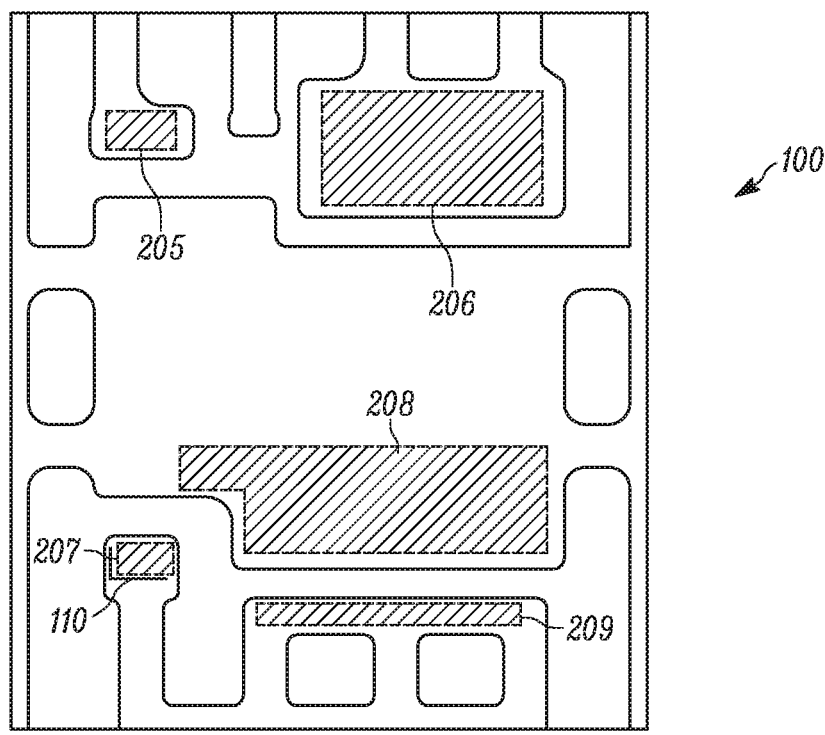
FIG. 2A is a top view illustrating one example of a lead frame having a die attachment material applied to mounting regions of the lead frame in accordance with some embodiments of the present application.

The method of making the semiconductor device may include applying a die attachment material to a substrate, such as a lead frame. FIG. 2A shows lead frame 100 after die attachment material 205-209 has been applied to mounting regions 105-109, respectively. The die attachment material is not particularly limited, and can generally be any material that can provide suitable mechanical and thermal (and optionally electrical) connection between a semiconductor die and a substrate (e.g., lead frame 100 depicted in FIG. 2A). Suitable die attachment materials include, but are not limited to, an epoxy, a polyimide, a silicon, a hybrid organic adhesive, and soft or eutectic solders. The die attachment materials can be applied to the lead frame in the form of a gel, paste, film, tape, or solder form. The die attachment material can be conductive or non-conductive. The die attachment material may be applied to the substrate using standard techniques, such as screen printing, syringe dispensing, stamp dispensing, epoxy-writer dispensing, shower-head dispensing, and film attachment.

At least a portion of the die attachment material can, in some embodiments, be applied adjacent or near to the non-conductive barrier material. The non-conductive barrier material may inhibit movement of the die attachment material to regions of the substrate on the other side of the non-conductive barrier material (e.g., regions that do not have any die attachment material). For example, the non-conductive barrier material may inhibit movement of the die attachment material to a region adjacent to an edge of a semiconductor die mounted on the substrate. In some embodiments, die attachment material is applied about 0 to about 150 μm from the non-conductive barrier material. In some embodiments, die attachment material is applied about 0 to about 100 μm from the non-conductive barrier material. In some embodiments, die attachment material is applied about 0 to about 50 μm from the non-conductive barrier material. In some embodiments, at least a portion of the non-conductive barrier material is disposed between a region of the substrate having the die attachment material and a region of the substrate that does not include the die attachment material.

Although FIG. 2A illustrates applying a die attachment material to all of the mounting regions, the skilled artisan will appreciate that the die attachment material can be applied to different mounting regions at different times during the method of making the semiconductor die. For example, die attachment material 206 may be applied to mounting region 106, and then a semiconductor die is disposed on mounting region 106. Die attachment material 207 and 208 can be subsequently applied to mounting regions 107 and 108, and then a second semiconductor die is disposed on mounting regions 107 and 108. Numerous other possible sequences of applying die attachment material to mounting regions are possible and within the scope of the present application.

The die attachment materials applied to each of the mounting regions can be the same or different. In some embodiments, the same die attachment material is applied to each of the mounting regions. For example, die attachment materials 205-209 can each be a solder having the same composition. In some embodiments, different die attachment materials are applied to different mounting regions. For example, die attachment materials 205 and 207-209 can be a solder having the same composition, while die attachment material 206 can be an adhesive tape.

It will be appreciated that during the method, the substrate (e.g., lead frame 100 depicted in FIG. 2A) and its various mounting regions may be interconnected in an array of substrates that can be singulated into individual packages during processing.

Figure 2B:
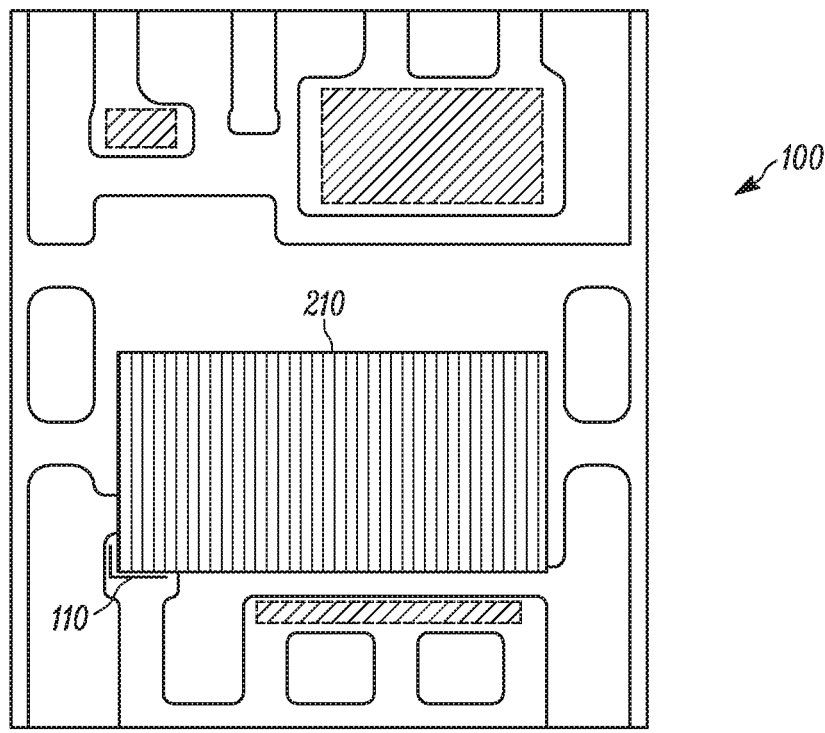
FIG. 2B is a top view illustrating one example of a lead frame having a semiconductor die disposed on mounting regions of the lead frame in accordance with some embodiments of the present application.

The method of making the semiconductor device may also include disposing a semiconductor die on the mounting regions of the substrate, such as a lead frame. FIG. 2B shows semiconductor die 210 disposed on die attachment material 207 and 208, which are applied to mounting regions 107 and 108, respectively. The die attachment material can fix the semiconductor die to the substrate after suitable processing. For example, the die attachment material can be solder that can fix the semiconductor die to the lead frame after soldering. As another example, the die attachment material can be an adhesive that is cured to fix the semiconductor die. In some embodiments, semiconductor die 210 may include one or more contact pads that can be electrically coupled to the mounting regions via the die attachment material. For example, semiconductor die 210 may be a MOSFET having a source contract pad electrically coupled to mounting region 108 and a gate contact pad electrically coupled to mounting region 107.

As shown in FIG. 2B, non-conductive barrier material 110 is adjacent to two edges and a corner of semiconductor die 210. However, the location and shape of the non-conductive barrier material is not limited to this configuration. In some embodiments, the non-conductive barrier material can be located entirely, or at least in part, under the footprint of the semiconductor die. In some embodiments, the non-conductive barrier material is not under the footprint of the semiconductor die and is spaced apart from edges and corners of the semiconductor die. In some embodiments, the die attachment material includes at least one edge that is about the same length than an edge of a mounting region adjacent or near the edge of the non-conductive barrier material. In some embodiments, the die attachment material includes at least one edge that is shorter than an edge of a mounting region adjacent or near the edge of the non-conductive barrier material. In some embodiments, the die attachment material includes at least one edge that is longer than an edge of a mounting region adjacent or near the edge of the non-conductive barrier material. The non-conductive barrier material may be adjacent to one, two, three, four, or more sides of the mounting region.

Figure 2C:
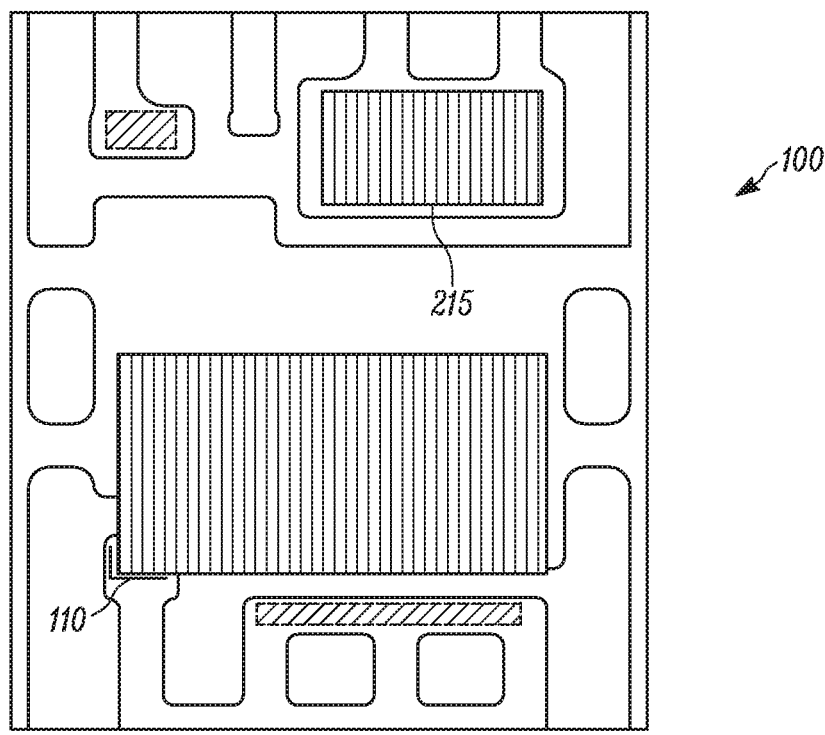
FIG. 2C is a top view illustrating one example of a lead frame having two semiconductor dies disposed on mounting regions of the lead frame in accordance with some embodiments of the present application.

The method of making the semiconductor device may optionally include disposing a second semiconductor die on the mounting regions of the substrate. FIG. 2C shows semiconductor die 215 disposed on die attachment material 206, which is applied to mounting region 106. In some embodiments, semiconductor die 215 is a low-side MOSFET and semiconductor die 210 is a high-side MOSFET. In some embodiments, semiconductor die 210 may include a contact pad that can be electrically coupled to the mounting region via the die attachment material.

Figure 2D:
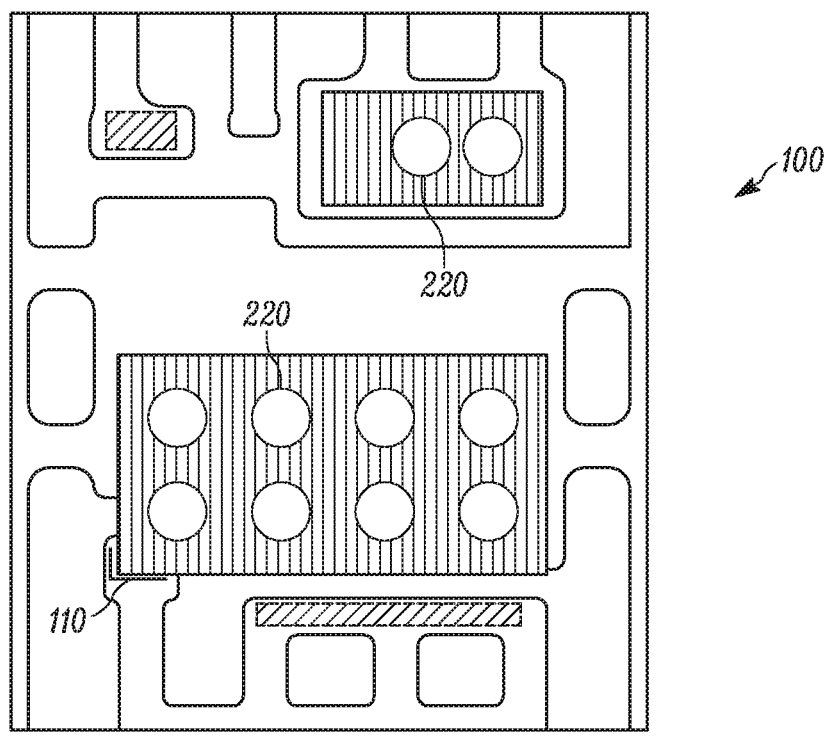
FIG. 2D is a top view illustrating one example of a lead frame having two semiconductor dies, where each die has die attachment material applied to the top surface and is disposed on mounting regions of the lead frame in accordance with some embodiments of the present application.

The method of making the semiconductor device may optionally include applying a die attachment material to one or more semiconductor devices disposed on the substrate. FIG. 2D shows die attachment material 220 applied to the top surface of semiconductor die 210 and the top surface of semiconductor die 215. In some embodiments, the die attachment material is applied to contact pads located on the top surfaces of the each of the semiconductor dies. The die attachment material applied to each of the top surfaces of each of the semiconductor dies can be the same or different. Moreover, the die attachment material applied to each of the top surfaces of each of the semiconductor dies can be the same or different than die attachment materials 205-209.

Figure 2E:
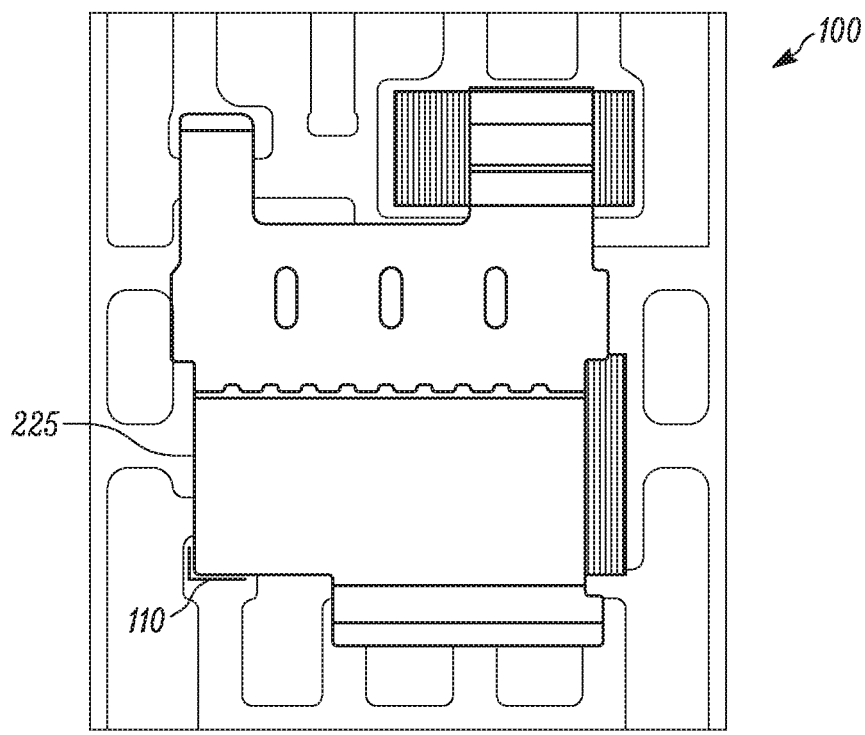
FIG. 2E is a top view illustrating one example of a lead frame having a conductive clip electrically coupling two semiconductor dies disposed on mounting regions of the lead frame in accordance with some embodiments of the present application.

The method of making the semiconductor device may also optionally include disposing a conductive substrate, such as a conductive metal clip, on one or more semiconductor dies. FIG. 2E shows conductive clip 225 disposed on semiconductor die 210 and 215. Conductive clip 225 may electrically couple a contact pad on semiconductor die 210, a contact pad on semiconductor die 215, mounting region 105, and mounting region 109.

The method of making the semiconductor device may also include various additional operations. In some embodiments, the semiconductor device can be treated to fix the various components together. For example, when the die attachment material is solder, the semiconductor device may subjected to reflow soldering and/or soldering to fix the components together (e.g., fix the semiconductor dies to the lead frame and conductive clip). As another example, the die attachment material may be subject to curing (e.g., heating) to fix the components together. In some embodiments, one or more die attachment materials are treated to fix the semiconductor die to the lead frame and conductive clip at about the same time. For example, solder applied below and on top of the semiconductor die is subject to reflow at the same time. During these operations to fix the various components together, it is possible for the die attachment material to flow into undesirable regions of the device causing, for example, an electrical short circuit or contamination. In some embodiments, one advantage of the method of making the semiconductor device is that the non-conductive barrier material can impede or prevent the movement of die attachment material into undesirable regions.

The method may, in some embodiments, include at least partially encapsulating components of the semiconductor device in a molding material (e.g., a resin). In some embodiments, one or more semiconductor dies are encapsulated in the molding material. In some embodiments, one or more substrates (e.g., the lead frame and/or the conductive clip) are at least partially encapsulated in the molding material. In some embodiments, the non-conductive barrier material is encapsulated in the molding material. In some embodiments, the die attachment material is encapsulated in the molding material. Portions of the lead frame and/or conductive clip may be exposed for electrically coupling one or more semiconductor dies to, for example, a printed circuit board.

The method may optionally include singulating the semiconductor device from an array of semiconductor devices interconnected by an array of substrates (e.g., lead frames). Each of the semiconductor devices in the array may be the same.

The method may optionally include removing the non-conductive barrier material from the substrate after fixing the semiconductor die to the substrate. For example, after a semiconductor die has been fix to the substrate (e.g., by soldering) the non-conductive barrier material may be removed from the substrate by, for example, apply a suitable solvent. The non-conductive barrier material may be removed after fixing the semiconductor die because the die attachment material may be unlikely to move after this process.

Although the method of making the semiconductor device includes the embodiments illustrated in FIGS. 2A-E, numerous alternative embodiments are within the scope of the present application. For example, although the method can use a metal lead frame, numerous other substrates can be used and are within the scope of the present application. Non-limiting examples of substrate that can be used in the method of making the semiconductor device include laminate substrates, printed circuit boards, ceramic carriers, films, tapes, wafers, conductive metal clips, semiconductor dies (e.g., in multi-stacked die packages or when attaching conductive metal clips), and semiconductor packages (e.g., in package-in-package attach and package-on-package attach).

Similarly, the number of semiconductor dies in the semiconductor device is not limited. In some embodiments, the method includes attaching only one semiconductor die to a substrate. In some embodiments, the method includes attaching two or more semiconductor dies to a substrate (e.g., two, three, four, or more semiconductor dies). The type of semiconductor die attached to the substrate is also not limited. In some embodiments, the method includes attaching a MOSFET to a substrate. In some embodiments, the method includes attaching a MOSFET to a substrate, where a non-conductive barrier material is disposed adjacent to a mounting region that is fixed to a contact pad on the MOSFET. In some embodiments, the method includes attaching a MOSFET to a substrate, where a non-conductive barrier material is disposed adjacent to a mounting region that is fixed to a gate contact pad on the MOSFET.

The dimensions and shape of the non-conductive barrier material is also not particularly limited. The skilled artisan, guided by the teachings in the present application, may select suitable dimensions and shape so as to inhibit or prevent movement of die attachment to particular regions in the semiconductor device. Potential factors for determining suitable shape and dimensions include, but are not limited to, how far the die attachment material is permitted to move, the nearby structures and designs, tool dimensional limits, and properties of the non-conductive barrier material itself. In some embodiments, the non-conductive barrier material surrounds a mounting region on the substrate. In some embodiments, the non-conductive barrier material partially surrounds a mounting region on the substrate. In some embodiments, the non-conductive barrier material surrounds a die attachment material on the substrate. In some embodiments, the non-conductive barrier material partially surrounds a die attachment material on the substrate.

In some embodiments, the non-conductive barrier material forms one or more straight lines (e.g., one, two, three, four, five, or more straight lines). In some embodiments, the non-conductive barrier material forms two or more interconnected straight lines. The interconnected straight lines may interconnect to form an angle of about 90 degrees or less adjacent to a mounting region (e.g., non-conductive barrier material 110 has a 90 degree angle adjacent to mounting region 107 as depicted in FIG. 1A). In some embodiments, the non-conductive barrier material includes at least one curved line. In some embodiments, the non-conductive barrier material does not include a curved line. In some embodiments, the non-conductive barrier material forms an enclosed-shape, such as a polygon, circle, semi-circle, oval, and the like. The enclosed shape may surround a mounting region where die attachment material can be applied.

Figure 3:
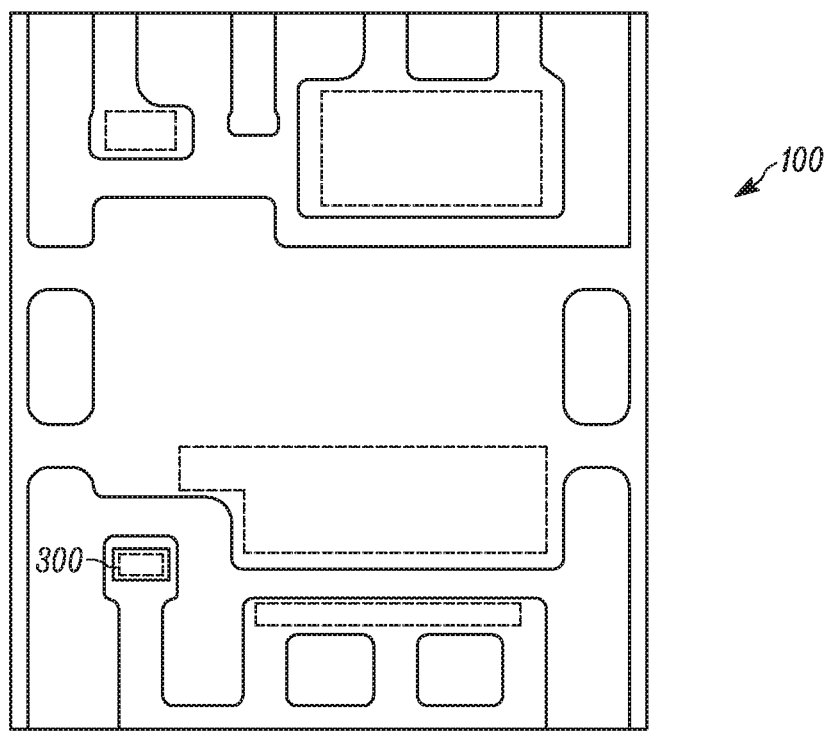
FIG. 3 is a top view illustrating one example of a lead frame in accordance with some embodiments of the present application.

FIG. 3 is a top view illustrating one example of a lead frame in accordance with some embodiments of the present application. As shown in FIG. 3, non-conductive barrier material 300 has a rectangular shape that can surround mounting region 107 of lead frame 100.

The width of the non-conductive barrier material can be selected to such that movement of the die attachment material is inhibited or prevented. In some embodiments, the width of the non-conductive barrier material is about 50 µm to about 400 µm. In some embodiments, the width of the non-conductive barrier material is about 100 µm to about 300 µm. The thickness of the non-conductive barrier material can also be selected such that movement of the die attachment material is inhibited or prevented. In some embodiments, the thickness of the non-conductive barrier material is about 10 µm to about 127 µm. In some embodiments, the thickness of the non-conductive barrier material is less than about 100 µm.

The number of separate non-conductive barrier materials is not particularly limiting. In some embodiments, only one continuous region of non-conductive barrier material is disposed on the substrate (e.g., only non-conductive barrier material 110 is disposed on lead frame 100 as depicted in FIG. 3). In some embodiments, two or more continuous regions (e.g., two, three, four, five, or more) of non-conductive barrier material is disposed on the substrate. Each of the continuous regions of the non-conductive barrier material may have the same shape or different. Each of the continuous regions may, for example, be adjacent or near different mounting regions where die attachment material can be applied. Each of the continuous regions may have the same or different shape and/or dimensions.

The non-conductive barrier material can be applied using various techniques. Examples of methods for applying the non-conductive barrier material include, but are not limited to, screen printing, syringe dispensing, stencil printing, stamping, taping, or film attachment. The non-conductive barrier material can be applied in various forms, such as a gel, paste, film, or tape. The non-conductive barrier material may be treated, for example, to harden or solidify the material. The non-conductive barrier material may also be treated to fix the material to the substrate. As an example, the non-conductive barrier may be cured by applying heat or radiation to the material after it is disposed on the substrate. These optional treatments may occur before or after the die attachment material is applied. For example, the non-conductive barrier material may cured at about the same time as a die attachment material (e.g., an adhesive) by heating both materials after they are applied to the substrate.

Some embodiments disclosed herein include a semiconductor device. The semiconductor device can be, for example, any device prepared according the methods disclosed in the present application. For example, the semiconductor device may be the device depicted in FIG. 2E. In some embodiments, the semiconductor device includes a substrate, a non-conductive barrier material applied to the substrate, a die attachment material applied to the substrate, and semiconductor die attached to the substrate by the die attachment material. The non-conductive barrier material can be disposed adjacent to the die attachment material and configured to prevent movement of the die attachment material to portions of the semiconductor device.

The substrate can be any of the substrates disclosed above with respect to the method of making the semiconductor device. For example, the substrate can be a metal lead frame. The non-conductive barrier material can also have any of the characteristics described above with respect to the method of making the semiconductor device. For example, the non-conductive barrier material can be a cured organic material having an 'L' shape. The semiconductor die can also have any of the characteristics describe above with respect to the method of making the semiconductor device. For example, the semiconductor die may be a MOSFET.

In some embodiments, the semiconductor device includes a molding material (e.g., a resin) that encapsulates the semiconductor die. The molding material may optionally encapsulate the non-conductive barrier material. The molding material may optionally encapsulate the die attachment material. In some embodiments, the molding material at least partially encapsulates the substrate.

Some embodiments disclosed herein include a lead frame. The lead frame may include a non-conductive barrier material applied to a portion of the lead frame. In some embodiments, the non-conductive barrier material is disposed adjacent to a mounting region of the lead frame. The lead frame can be any lead frame disclosed above with respect to the method of making semiconductor device. As an example, the lead frame can be lead frame 100 as depicted in FIGS. 1A and 1B. The non-conductive barrier material can have any of the characteristics describe above with respect to the method of making the semiconductor device. For example, the non-conductive barrier material can be an organic tape with a polygonal shape. In some embodiments, the lead frame can include etched regions of a side of the lead frame opposite the side having the non-conductive barrier material.

In some embodiments, the lead frame can be interconnected in an array of lead frames. The array of leads frames can be processed using standard semiconductor manufacturing techniques to obtain a plurality of semiconductor devices. The processing may include singulating the array to form individual semiconductor devices. In some embodiments, each lead frame in the array is the same. In some embodiments, each lead frame in the array includes a non-conductive barrier material. The non-conductive barrier may be disposed adjacent to a mounting region of the lead frame.

From all the foregoing one skilled in the art can determine that according to one embodiment, a semiconductor device comprises: providing a substrate, the substrate comprising a non-conductive barrier material disposed on a first portion of a first side of the substrate; applying a die attachment material to a second portion of the first side of the substrate, wherein the non-conductive barrier material is disposed between a first region of the first side of the substrate having at least a portion of the die attachment material and a second region of the first side of the substrate that does not have the die attachment material; and attaching a semiconductor die to at least the first region of the first side of the substrate.

From all the foregoing one skilled in the art can determine that according to one embodiment, a semiconductor device comprises: a lead frame; a non-conductive barrier material disposed on a first portion of a first side the lead frame; a die attachment material disposed on second a portion of the first side of the lead frame, wherein the non-conductive barrier material is disposed between a first region of the first side of the lead frame having at least a portion of the die attachment material and a second region of the first side of the substrate that does not have the die attachment material; and a semiconductor die attached to at least the first region of the first side of the lead frame.

From all the foregoing one skilled in the art can determine that according to one embodiment, a lead frame comprises: a conductive substrate having a mounting region configured to attach a semiconductor die; and a non-conductive barrier material disposed on the conductive substrate, wherein the non-conductive barrier material is adjacent to the mounting region.

In view of all of the above, it is evident that a novel device and method is disclosed. Included, among other features, are substrates, such as a lead frame or conductive clip, having a non-conductive barrier material that can reduce or prevent movement of die attachment material.

While the subject matter of the present disclosure is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art. For example, the subject matter has been described with respect to particular lead frame configurations, however various substrates may also be used. As another example, the subject matter has been described with respect to semiconductor devices having two semiconductor dies, however other semiconductor devices with more or less semiconductor dies can readily incorporate the features of the present application.

Furthermore, while some embodiments described herein include some but not other features included in other embodiments, combinations of features of different embodiments are meant to be within the scope of the present disclosure, and form different embodiments, as would be understood by those skilled in the art.

What is claimed is:

1. A method of making a semiconductor device, the method comprising:
    applying a non-electrically conductive barrier material to a first portion of a side of a substrate;
    after applying the non-electrically conductive barrier material, applying a die attachment material to a second portion of the side of the substrate;
    coupling a semiconductor die to the die attachment material; and
    impeding movement of the die attachment material away from a footprint of the semiconductor die with the non-electrically conductive barrier material.

2. The method of claim 1, wherein the footprint of the semiconductor die is larger than a footprint of the non-electrically conductive barrier material.

3. The method of claim 1, wherein the non-electrically conductive barrier material is one of an organic material, a gel, a wet film, a dry film, an adhesive, or any combination thereof.

4. The method of claim 1, wherein applying the die attachment material further comprises applying an adhesive film to the substrate to form the non-electrically conductive barrier material on the first portion of the side of the substrate.

5. The method of claim 1, wherein applying the die attachment material further comprises screen printing an adhesive on the substrate to form the non-electrically conductive barrier material on the first portion of the side of the substrate.

6. The method of claim 1, wherein applying the die attachment material further comprises one of syringe dispensing, stencil printing, stamping, taping, or film attachment to form the non-electrically conductive barrier material on the first portion of the side of the substrate.

7. The method of claim 1, wherein applying the die attachment material further comprises curing the non-electrically conductive barrier material on the first portion of the side of the substrate.

8. The method of claim 1, wherein the substrate is a one of a lead frame, a laminate, a printed circuit board, a ceramic carrier, a tape, a semiconductor wafer, a semiconductor die, a semiconductor package, or any combination thereof.

9. The method of claim 1, wherein the non-electrically conductive barrier material forms an enclosed shape.

10. The method of claim 1, wherein the die attachment material is one of an epoxy, a polyimide, a silicone, an organic adhesive, a solder, or any combination thereof.

11. The method of claim 1, wherein the die attachment material is a one of a gel, a paste, a film, a tape, a solder form, or any combination thereof.

12. The method of claim 1, wherein the die attachment material is a solder, and wherein coupling a semiconductor die to the die attachment material further comprises reflow soldering the semiconductor die to the second portion of the side of the substrate.

13. A method of making a semiconductor device, the method comprising:
    applying a non-electrically conductive barrier material to a first portion of a side of a substrate;
    after applying the non-electrically conductive barrier material, applying a die attachment material to an exposed mounting region comprised in a second portion of the side of the substrate;
    electrically coupling a contact pad of a semiconductor die to the exposed mounting region through the die attachment material; and
    impeding movement of the die attachment material away from a footprint of the semiconductor die with the non-electrically conductive barrier material.

14. The method of claim 13, wherein the footprint of the semiconductor die is larger than a footprint of the non-electrically conductive barrier material.

15. The method of claim 13, wherein the non-electrically conductive barrier material is one of an organic material, a gel, a wet film, a dry film, an adhesive, or any combination thereof.

16. The method of claim 13, wherein applying the die attachment material further comprises applying an adhesive film to the substrate to form the non-electrically conductive barrier material on the first portion of the side of the substrate.

17. The method of claim 13, wherein applying the die attachment material further comprises screen printing an adhesive on the substrate to form the non-electrically conductive barrier material on the first portion of the side of the substrate.

18. The method of claim 13, wherein applying the die attachment material further comprises one of syringe dispensing, stencil printing, stamping, taping, or film attachment to form the non-electrically conductive barrier material on the first portion of the side of the substrate.

19. The method of claim 13, wherein applying the die attachment material further comprises curing the non-electrically conductive barrier material on the first portion of the side of the substrate.

20. The method of claim 13, wherein the substrate is a one of a lead frame, a laminate, a printed circuit board, a ceramic carrier, a tape, a semiconductor wafer, a semiconductor die, a semiconductor package, or any combination thereof.

\* \* \* \* \*